(12) United States Patent
Curtin et al.

(10) Patent No.: US 8,481,850 B2
(45) Date of Patent: Jul. 9, 2013

(54) DYE DOPED GRAPHITE GRAPHENE SOLAR CELL ON ALUMINUM

(76) Inventors: Lawrence Curtin, Fort Pierce, FL (US); Zechariah K. Curtin, Ft. Pierce, FL (US)

( * ) Notice: Subject to any disclaimer, the term of this patent is extended or adjusted under 35 U.S.C. 154(b) by 559 days.

(21) Appl. No.: 12/503,353

(22) Filed: Jul. 15, 2009

(65) Prior Publication Data

US 2010/0012176 A1    Jan. 21, 2010

Related U.S. Application Data

(60) Provisional application No. 61/080,775, filed on Jul. 15, 2008.

(51) Int. Cl.
*H01L 31/00* (2006.01)
(52) U.S. Cl.
USPC ............................................................. 136/263
(58) Field of Classification Search
USPC .................................................. 136/252–265
See application file for complete search history.

(56) References Cited

U.S. PATENT DOCUMENTS

| | | | | |
|---|---|---|---|---|
| 4,112,457 A | * | 9/1978 | D'Aiello | 136/255 |
| 4,585,578 A | * | 4/1986 | Yonahara et al. | 252/511 |
| 2004/0003837 A1 | * | 1/2004 | Mauk | 136/244 |
| 2006/0070651 A1 | | 4/2006 | Kang et al. | |
| 2006/0266411 A1 | | 11/2006 | Sugiyama et al. | |
| 2007/0157962 A1 | * | 7/2007 | Gronet | 136/251 |
| 2007/0204906 A1 | | 9/2007 | Abe et al. | |
| 2008/0066802 A1 | * | 3/2008 | Reddy | 136/258 |

OTHER PUBLICATIONS

Baskraran et al "Carbon Nanotubes with Covalently Linked Porphyrin Antennae: Photoinduced Electron Transfer", Journal of the American Chemical Society, vol. 127, Issue 19, pp. 6916-69-17 (2005).*

Richard J. Lewis, Sr. "Hawley's Condensed Chemical Dictionary, 12th Edition", John Wiley & Sons, Inc., New York pp. 157 and 1098 (1993).*

* cited by examiner

*Primary Examiner* — Alexander Kollias

(57) ABSTRACT

An efficient dye doped solar cell that improves upon the conventional dye-sensitized solar cells known within the art. The present inventive dye doped solar cell and its method of manufacture completely eliminate an electrolyte component common to conventional solar cells thereby removing numerous complications found in conventional dye doped cells such as inconsistent reproducibility and safety issues due to leakage of the electrolyte component. The dye doped solar cell of the present invention provides a novel replacement for the conventional electrolyte layer that provides significant improvements in both the safety and function of the inventive dye doped solar cell while eliminating the troublesome electrolyte component that is required in the conventional dye-sensitized doped solar cells known within the art.

1 Claim, 3 Drawing Sheets

DYE DOPED GRAPHITE GRAPHENE SOLAR CELL ON ALUMINUM

CROSS REFERENCE TO RELATED APPLICATIONS

This application claims the benefit of provisional patent application Ser. No. 61/080,775, filed with the USPTO on Jul. 15, 2008, which is herein incorporated by reference in its entirety.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISK

Not applicable.

BACKGROUND OF THE INVENTION

1. Field of the Invention

The present invention relates to a dye-sensitized or dye doped solar cell in which light energy is directly converted into electric energy, and a method for manufacturing such dye-sensitized or dye doped solar cells.

2. Background Art

When a photovoltaic material is irradiated with light, electrons restricted to an atom in the photovoltaic material are released by light energy to move freely, which generates free electrons and holes. The free electrons and the holes are efficiently separated so that electric energy is continuously extracted. That is, the photovoltaic material is capable of converting light energy to electric energy. Such photovoltaic material has been utilized as a solar cell and the like.

The common solar cell is produced by first forming an electrode on a support such as a glass plate coated with a transparent conductive film, subsequently forming a semiconductor film having a photosensitizer adsorbed thereon on a surface of the electrode, thereafter providing a counter electrode comprising a support such as a glass plate coated with another transparent conductive film, sealing an electrolyte between the counter electrode and the semiconductor film, and finally sealing the side faces with a resin or the like.

When the above semiconductor film is irradiated with sunlight, the photosensitizer adsorbed on the semiconductor absorbs visible-region rays to thereby excite itself. Electrons generated by this excitation move to the semiconductor, next to the transparent conductive glass electrode, and further to the counter electrode across a lead connecting the two electrodes to each other. The electrons having reached the counter electrode reduce the oxidation-reduction system in the electrolyte. On the other hand, the photosensitizer having caused electrons to move to the semiconductor is in oxidized form. This oxidized form is reduced by the oxidation-reduction system of the electrolyte to thereby return to the original form. In this manner, electrons continuously flow. Therefore, functioning as the solar cell can be realized.

The electrolyte to be sealed between the electrodes is dissolved in a solvent, selected according to the type of the electrolyte, to thereby obtain an electrolytic solution. The electrolytic solution is sealed in a cavity created by sealing the sides of the photovoltaic cell with, for example, a resin.

The above solvent can be selected from among, for example, water, alcohols, oligoesters, carbonates such as propione carbonate, phosphoric acid esters, dimethylformamide, dimethyl sulfoxide, N-methylpyrrolidone, N-vinylpyrrolidone, sulfur compounds such as sulfolane 66, ethylene carbonate and acetonitrile.

One dye-sensitized solar cell that has widely drawn attention because of its higher photovoltaic efficiency comprises percolating networks of liquid electrolyte and dye-coated sintered titanium dioxide and was developed by Dr. Michael Grätzel and coworkers at the Swiss Federal Institute of Technology. The solar cell is comprised of an electrolyte solution layer sandwiched between a semiconductor electrode and a counter electrode. When the semiconductor electrode is irradiated with light, electrons are excited therein and transferred to the counter electrode through an electric circuit. The transferred electrons are re-transferred as ions to the semiconductor electrode through the electrolyte. This cycle is repeated to extract electric energy.

The Grätzel solar cell, as shown in FIG. 1, includes a transparent substrate 1 on one side of which a transparent conductive film 7a is formed, and a conductive substrate 5 on which a transparent conductive film 7b and a semiconductor electrode (dye-sensitized semiconductor electrode 4) carrying a sensitizing dye is formed. The two substrates are stacked one upon the other with an electrolyte 3 contained therebetween, and the assembly is sealed with resin 8. A porous titanium oxide film is provided on the surface of the conductive substrate and is coated with a sensitizing dye that can efficiently absorb solar light, such as ruthenium complex. The porous titanium oxide film is used as a dye-sensitized semiconductor electrode 4, whereby an electron excited by light is injected into the titanium oxide and a flow of electric current can be caused. This type of solar cells requires electrolyte for the exchange of electrons, and generally iodine electrolyte is used for this purpose.

In the conventional dye-sensitized solar cell shown in FIG. 1, the electrolyte is only sealed and contained by a thick coating of resin at the peripheral portion (near the cross section), which is then cured. However, the amount of electrolyte may vary due to different intervals between the two substrates from one solar cell to another, or even within each solar cell. As a result, there have been problems in terms of reproducibility and safety due to the leakage of the electrolyte that may be caused when the solar cell is inclined, for example.

When the electrolyte is used in the form of such an electrolytic solution, the solar cell may suffer from, during a long-term service, alteration of solvent molecules, decomposition of solvent molecules, vaporization of low-boiling-point solvent, leakage of electrolytic solution (solvent and/or electrolyte) from sealed parts, etc. with the result that the performance, such as photovoltaic transduction efficiency, thereof is deteriorated. That is, the use of the electrolyte in the form of an electrolytic solution has a drawback in that the long-term stability is poor.

Moreover, depending on the type of electrolyte used in the electrolytic solution, hygroscopicity is exhibited to thereby absorb water, and it may occur that the water causes the electrolyte and the photosensitizer to decompose to result in performance deterioration.

Furthermore, the surface irregularities of the porous titanium oxide film used as the dye-sensitized semiconductor electrode vary depending on the coating method used, the particle diameter, or the thickness of the film. Should a projecting portion of the film come into contact with the conductive film on the opposite substrate, the dye-sensitized semiconductor electrode will be electrically in contact with the conductive film, bypassing the electrolyte. This would prevent the sufficient exchange of electrons, and lead to decrease in efficiency and destabilization of performance of the solar cell.

Conventionally, fabrication of dye-sensitized solar cells requires a high temperature sintering process (> about 400° C.) to achieve sufficient interconnectivity between the nanoparticles and enhanced adhesion between the nanoparticles and a transparent substrate.

Although the photovoltaic cells of a Grätzel cell are fabricated from relatively inexpensive raw materials, the high temperature sintering technique used to make these cells limits the cell substrate to rigid transparent materials, such as glass, and consequently limits the manufacturing to batch processes and the applications to those tolerant of the rigid structure. Rigid substrates are fragile, heavy, inflexible, and costly to manufacture, and consequently, they do not lend themselves to conventional shelf pricing systems powered by photovoltaic devices.

The photovoltaic transduction efficiency of conventional solar cells is not always satisfactory, and there are limitations in the application thereof. Therefore, there is a constant demand for improved solar cells and further enhancement of light utilization ratios.

It is a further aspect of the present invention to provide a photovoltaic cell which is safer, eliminates troublesome components such as an electrolyte, has excellent long-term stability, ensures a high light utilization ratio, and exhibits high photovoltaic transduction efficiency.

BRIEF SUMMARY OF THE INVENTION

In accordance with one embodiment, a dye doped solar cell comprising a first layer, wherein the first layer is doped and comprises holes or vacancies within the first layer, a second layer applied to the first layer, wherein the second layer comprises an intrinsic undoped layer, and a dye doped third layer applied to the second layer.

In accordance with another embodiment of the present invention, a dye doped solar cell comprising a substrate comprising aluminum; a first layer applied to the substrate, wherein the first layer comprises a material selected from the group consisting of graphite, graphene, C60, carbon nanotubes, and combinations thereof and is doped with boron thereby providing holes or vacancies within the first layer; an intrinsic undoped second layer applied to the first layer, wherein the second layer comprises a material selected from the group consisting of graphite, graphene, C60, carbon nanotubes, and combinations thereof; a doped third layer applied to the second layer, wherein the third layer comprises a material selected from the group consisting of graphite, graphene, C60, carbon nanotubes, and combinations thereof and is further doped with a substance selected from the group consisting of porphyrin, blood, and a combination of blood and chlorophyll; a clear conductive layer applied to the third layer, wherein the clear conductive layer comprises tin oxide; a strip of aluminum disposed along one edge of the dye doped solar cell, wherein the strip of aluminum serves as a top contact for the solar cell; and a clear protective cover applied atop both the clear conductive layer and the strip of aluminum for providing protection to the solar cell.

Further in accordance with still another embodiment of the present invention, a method of manufacturing a dye doped solar cell, the method comprising the steps of providing a substrate; applying a first layer to the substrate, wherein the first layer is doped and further comprises holes or vacancies within the first layer, the first layer further comprising a material selected from the group consisting of graphite, graphene, C60, carbon nanotubes, and combinations thereof; applying an intrinsic undoped second layer to the first layer, wherein the second layer comprises a material selected from the group consisting of graphite, graphene, C60, carbon nanotubes, and combinations thereof; and applying a doped third layer to the second layer, wherein the third layer comprises a material selected from the group consisting of graphite, graphene, C60, carbon nanotubes, and combinations thereof and said third layer is doped with a substance selected from the group consisting of porphyrin, blood, and a combination of blood and chlorophyll.

DETAILED DESCRIPTION OF THE INVENTION

Although the following detailed description contains many specifics for the purposes of illustration, anyone of ordinary skill in the art will appreciate that many variations and alterations to the following details are within the scope of the invention. Accordingly, the following preferred embodiments of the invention are set forth without any loss of generality to, and without imposing limitations upon, the claimed invention.

Figure 1:
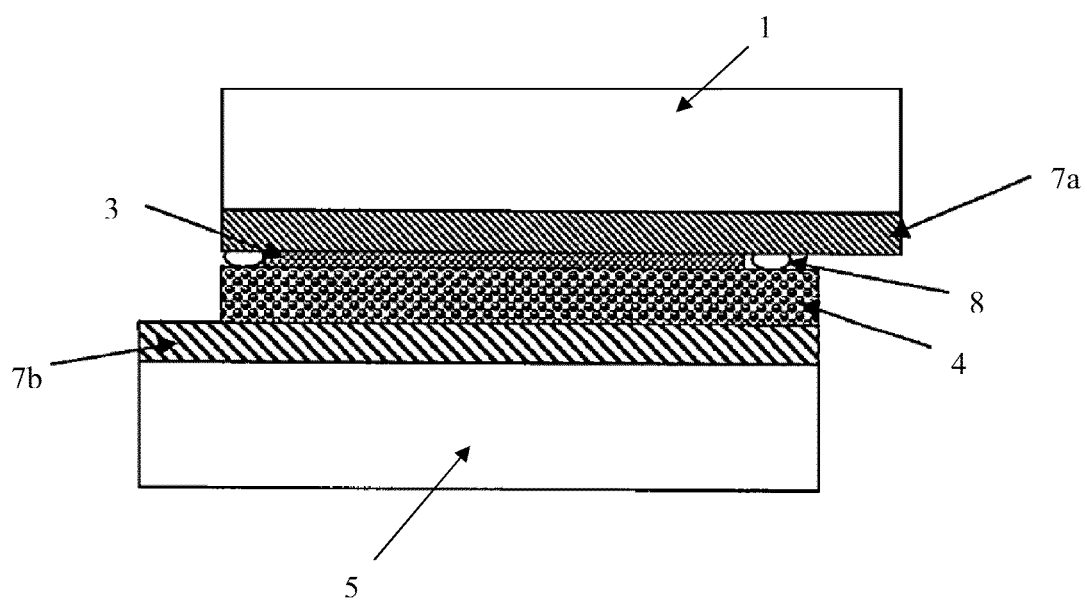
FIG. 1 depicts a schematic cross section example of a conventional dye-sensitized solar cell.
Figure 2:
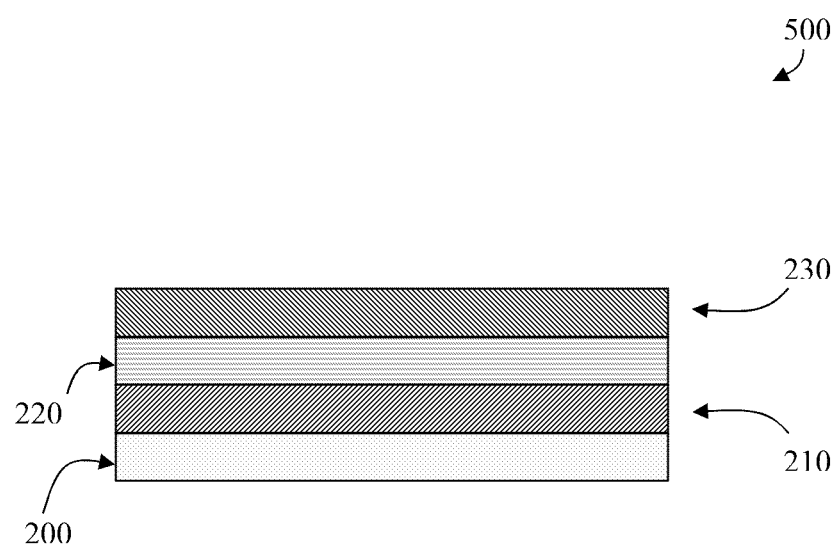
FIG. 2 depicts a cross-sectional view of an embodiment of dye doped solar cell layers of the present invention.

A preferred embodiment of the layering configuration of solar cell layers 500 of the present invention is illustrated in FIG. 2. The substrate 200 may comprise aluminum that may be provided in the form of aluminum foil, an aluminum sheet, or the like. The substrate 200 need not be limited to only such embodiments of material but may comprise any additional substrate materials known to one of ordinary skill in the art.

A first layer 210 applied to the substrate 200 may comprise graphite, graphene, C60, carbon nanotubes, or any combinations thereof that may be doped to create holes or vacancies within the first layer 210. Such a first layer 210 may be doped with boron or any other material known within the art to create the holes or vacancies within the first layer 210. Additionally, the first layer 210 may be applied to the substrate 200 in the form of a thermoset coating. Such a thermoset coating may be clear or transparent and allow the first layer 210 to bond with the substrate 200.

A second layer 220 or an intrinsic undoped layer may comprise a pure carbon, non-conductive layer. The second layer 220 may comprise undoped graphite, graphene, $C_{60}$, carbon nanotubes, or any combinations thereof. The second layer 220 also may be applied to the first layer 210 in the form of a thermoset coating. Such a thermoset coating may be clear or transparent and allow the second layer 220 to bond with the first layer 210.

A subsequent third layer 230 may comprise dye doped graphite, graphene, C60, carbon nanotubes, or any combinations thereof. The dye component of the third layer 230 may comprise porphyrin, blood, a combination of blood and chlorophyll, or any other similar dyes or combination of dyes and/or other materials known within the art. The third layer 230 also may be applied to the second layer 220 in the form of a thermoset coating. Such a thermoset coating may be clear or transparent and allow the third layer 230 to bond with the second layer 220.

Figure 3:
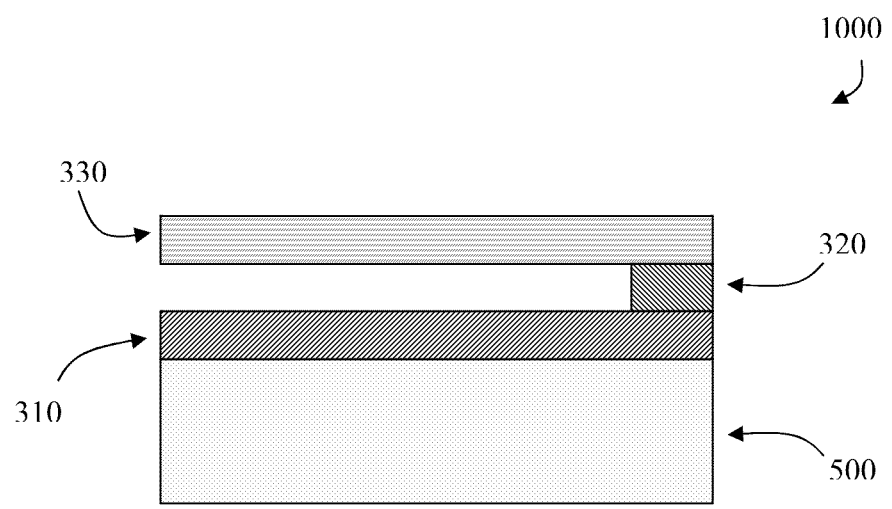
FIG. 3 depicts a cross-sectional view of an embodiment of a dye doped solar cell of the present invention.

As depicted in FIG. 3, a clear conductive layer 310 may be applied to the above-mentioned solar cell layers 500 that are shown in FIG. 2. The clear conductive layer 310 may comprise tin oxide or any other clear conductive materials or combinations thereof known within the art. Next, a thin strip of aluminum 320 may be adhered or otherwise fixed to one of the edges of the solar cell layers 500 after the clear conductive layer 310 has been applied. The strip of aluminum 320 may comprise aluminum foil, an aluminum sheet, or the like. The strip of aluminum 320 serves as the top contact for the dye doped solar cell 1000. In a final step, a clear protective cover 330 that acts as a sealant may be adhered or otherwise fixed or fastened atop the solar cell layers 500 (atop both the clear conductive layer 310 and the strip of aluminum 320) and thereby complete the construction of a preferred embodiment of a dye doped solar cell 1000 of the present invention. The clear protective cover 330 may comprise a flexible plastic material capable of covering, protecting, and/or sealing the solar cell 1000 from undesired external factors and forces.

Accordingly the reader will see that, according to the description and embodiments of the present invention, the present invention provides for an efficient dye doped solar cell that improves upon conventional dye doped solar cells known within the art. The dye doped solar cell of the present invention completely removes the conventional and well known electrolyte component from the inventive solar cells 1000 of the present invention thereby eliminating numerous complications common within conventional dye doped solar cells that may include inconsistent reproducibility and safety issues due to the leakage of the electrolyte. In conventional dye doped solar cells, the electrolyte may only be sealed and contained by a thick coating of resin along the peripheral portion of the conventional solar cells. The dye doped solar cell of the present invention provides for a novel replacement of the electrolyte later thereby creating significant improvements in the safety and functionality of dye doped solar cells while also eliminating the problematic electrolyte component that is common to conventional dye doped solar cells known within the art.

While the above description contains much specificity, these should not be construed as limitations on the scope of any embodiment, but as exemplifications of the presently preferred embodiments thereof. Many other ramifications and variations are possible within the teachings of the various embodiments.

Thus the scope of the invention should be determined by the appended claims and their legal equivalents, and not by the examples given.

What is claimed is:

1. A dye doped solar cell comprising:
    a substrate comprising aluminum;
    a first layer applied to said substrate, wherein said first layer comprises a material selected from the group consisting of graphite, graphene, $C_{60}$, carbon nanotubes, and combinations thereof and is doped with boron thereby providing holes or vacancies within said first layer;
    an intrinsic undoped second layer applied to said first layer, wherein said second layer comprises a material selected from the group consisting of graphite, graphene, $C_{60}$, carbon nanotubes, and combinations thereof;
    a doped third layer applied to said second layer, wherein said third layer comprises a material selected from the group consisting of graphite, graphene, $C_{60}$, carbon nanotubes, and combinations thereof and is further dye doped with a dopant selected from the group consisting of porphyrin, blood, and a combination of blood and chlorophyll;
    a clear conductive layer applied to said third layer, wherein said clear conductive layer comprises tin oxide;
    a strip of aluminum disposed along one edge of said dye doped solar cell, wherein said strip of aluminum serves as a top contact for said solar cell; and
    a clear protective cover applied atop both said clear conductive layer and said strip of aluminum for providing protection to said solar cell.

* * * * *